(12) United States Patent
Lung

(10) Patent No.: US 7,158,420 B2
(45) Date of Patent: Jan. 2, 2007

(54) INVERSION BIT LINE, CHARGE TRAPPING NON-VOLATILE MEMORY AND METHOD OF OPERATING SAME

(75) Inventor: Hsiang Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 85 days.

(21) Appl. No.: 11/118,839

(22) Filed: Apr. 29, 2005

(65) Prior Publication Data

US 2006/0245246 A1    Nov. 2, 2006

(51) Int. Cl.
   *G11C 11/34* (2006.01)
(52) U.S. Cl. ............... 365/185.3; 365/185.33; 365/185.15; 365/185.28; 257/324
(58) Field of Classification Search .......... 365/185.3, 365/185.33, 185.15, 185.28; 257/324
   See application file for complete search history.

(56) References Cited

U.S. PATENT DOCUMENTS

| | | | |
|---|---|---|---|
| 4,959,812 A | 9/1990 | Momodomi et al. | |
| 5,270,969 A | 12/1993 | Iwahashi | |
| 5,278,439 A | 1/1994 | Ma et al. | |
| 5,338,952 A * | 8/1994 | Yamauchi | 365/185.15 |
| 5,355,464 A | 10/1994 | Fandrich et al. | |
| 5,408,115 A | 4/1995 | Chang | |
| 5,424,569 A | 6/1995 | Prall | |
| 5,448,517 A | 9/1995 | Iwahashi | |
| 5,483,486 A | 1/1996 | Javanifard et al. | |
| 5,485,422 A | 1/1996 | Bauer et al. | |
| 5,509,134 A | 4/1996 | Fandrich et al. | |
| 5,515,324 A | 5/1996 | Tanaka | |
| 5,566,120 A | 10/1996 | D'Souza | |
| 5,602,775 A | 2/1997 | Vo | |
| 5,644,533 A | 7/1997 | Lancaster et al. | |
| 5,694,356 A | 12/1997 | Wong et al. | |
| 5,745,410 A | 4/1998 | Yiu et al. | |
| 5,753,950 A | 5/1998 | Kojima | |
| 5,768,192 A | 6/1998 | Eitan | |
| RE35,838 E | 7/1998 | Momodomi et al. | |
| 5,877,054 A | 3/1999 | Yamauchi | |
| 5,895,949 A | 4/1999 | Endoh | |
| 5,966,603 A | 10/1999 | Eitan | |
| 6,011,725 A | 1/2000 | Eitan | |

(Continued)

FOREIGN PATENT DOCUMENTS

JP    09162313    6/1997

(Continued)

OTHER PUBLICATIONS

U.S. Appl. No. 11/085,444, filed Mar. 21, 2005, entitled "Method For Manufacturing a Multiple-Gate Charge Trapping Non-Volatile Memory," 71 pages.

(Continued)

*Primary Examiner*—Richard Elms
*Assistant Examiner*—Eric J. Wendler
(74) *Attorney, Agent, or Firm*—Mark Haynes; Haynes Beffel & Wolfeld LLP

(57) ABSTRACT

A charge trapping memory device in which a field induced inversion layer is used to replace the source and drain implants. The memory cell are adapted to store two bits, one on the left side and one on the right side of the charge trapping structure. A positive threshold voltage erase state is induced using negative gate voltage Fowler Nordheim FN tunneling which establishes a charge balance condition at a positive voltage. A low current, source side, hot electron injection programming method is used.

24 Claims, 7 Drawing Sheets

U.S. PATENT DOCUMENTS

| | | | |
|---|---|---|---|
| 6,034,896 | A | 3/2000 | Ranaweera et al. |
| 6,074,917 | A | 6/2000 | Chang et al. |
| 6,096,603 | A | 8/2000 | Chang et al. |
| 6,151,248 | A | 11/2000 | Harari et al. |
| 6,172,907 | B1 | 1/2001 | Jenne |
| 6,194,272 | B1 | 2/2001 | Sung |
| 6,215,148 | B1 | 4/2001 | Eitan |
| 6,219,276 | B1 | 4/2001 | Parker |
| 6,297,096 | B1 | 10/2001 | Boaz |
| 6,320,786 | B1 | 11/2001 | Chang et al. |
| 6,363,013 | B1 | 3/2002 | Lu et al. |
| 6,396,741 | B1 | 5/2002 | Bloom et al. |
| 6,436,768 | B1 | 8/2002 | Yang et al. |
| 6,458,642 | B1 | 10/2002 | Yeh et al. |
| 6,487,114 | B1 | 11/2002 | Jong et al. |
| 6,512,696 | B1 | 1/2003 | Fan et al. |
| 6,522,585 | B1 | 2/2003 | Pasternak |
| 6,538,923 | B1 | 3/2003 | Parker |
| 6,552,386 | B1 | 4/2003 | Wu |
| 6,566,699 | B1 | 5/2003 | Eitan |
| 6,587,903 | B1 | 7/2003 | Roohparvar |
| 6,614,070 | B1 | 9/2003 | Hirose et al. |
| 6,614,694 | B1 | 9/2003 | Yeh et al. |
| 6,643,181 | B1 | 11/2003 | Sofer et al. |
| 6,643,185 | B1 | 11/2003 | Wang et al. |
| 6,645,813 | B1 | 11/2003 | Hsieh |
| 6,646,924 | B1 | 11/2003 | Tsai et al. |
| 6,657,894 | B1 | 12/2003 | Yeh et al. |
| 6,670,240 | B1 | 12/2003 | Ogura et al. |
| 6,670,671 | B1 | 12/2003 | Sasago et al. |
| 6,690,601 | B1 | 2/2004 | Yeh et al. |
| 6,714,457 | B1 | 3/2004 | Hsu et al. |
| 6,798,012 | B1 | 9/2004 | Ma et al. |
| 6,856,551 | B1 | 2/2005 | Mokhlesi et al. |
| 6,885,044 | B1 | 4/2005 | Ding |
| 6,911,691 | B1 * | 6/2005 | Tomiie et al. ............... 257/324 |
| 6,912,163 | B1 | 6/2005 | Zheng et al. |
| 6,933,555 | B1 | 8/2005 | Hsieh |
| 6,937,511 | B1 | 8/2005 | Hsu et al. |
| 7,018,895 | B1 | 3/2006 | Ding |
| 7,075,828 | B1 * | 7/2006 | Lue et al. ............... 365/185.24 |
| 2002/0167844 | A1 | 11/2002 | Han et al. |
| 2002/0179958 | A1 | 12/2002 | Kim |
| 2003/0036250 | A1 | 2/2003 | Lin et al. |
| 2003/0185055 | A1 | 10/2003 | Yeh et al. |
| 2004/0084714 | A1 | 5/2004 | Ishii et al. |
| 2004/0145024 | A1 | 7/2004 | Chen et al. |
| 2005/0001258 | A1 | 1/2005 | Forbes |
| 2006/0044872 | A1 | 3/2006 | Nazarian |

FOREIGN PATENT DOCUMENTS

| | | |
|---|---|---|
| JP | 11233653 | 8/1999 |
| WO | WO 94/28551 | 12/1994 |

OTHER PUBLICATIONS

U.S. Appl. No. 10/855,286, filed May 2004, entitled "NAND-Type Non-Volatile Memory Cell And Method For Operating Same," 15 pages.

U.S. Appl. No. 11/085,458, filed Mar. 21, 2005, entitled "Charge Trapping Non-Volatile Memory And Method For Gate-by-Gate Erase For Same," 73 pages.

U.S. Appl. No. 11/085,325, filed Mar. 2005, entitled "Memory Array Including Multiple-Gate Charge Trapping Non-Volatile Cells," 74 pages.

U.S. Appl. No. 11/085,326, filed Mar. 21, 2005, entitled "Charge Trapping Non-Volatile Memory With Two Trapping Locations Per Gate, And Method For Operating Same," 73 pages.

U.S. Appl. No. 11/085,300, filed Mar. 21, 2005, entitled "Charge Trapping Non-Volatile Memory And Method For Operating Same," 73 pages.

Fujiwara, I., et al., "0.13 μm MONOS single transistor memory cell with separated source lines," IEDM 1998, 995-998.

Chang, Kuo-Tung, et al., "A New SONOS Memory Using Source-Side Injection for Programming," IEEE Electron Device Letters, vol. 19, No. 7, Jul. 1998, 253-255.

Yeh, C.C., et al., "PHINES: A Novel Low Power Program/Erase, Small Pitch, 2-Bit per Cell Flash Memory," IEEE IEDM, 2002, 931-934.

Sasago, Y, et al., "90-nm-node multi-level AG-AND type flash memory with cell size of true 2 F2/bit and programming throughput of 10 MB/s," IEEE, 2003, 4 pages.

Leave Blank.

Kobayashi, T., et al., "A Giga-Scale Assist-Gate (AG)-AND-Type Flash Memory Cell with 20-MB/s Programming Throughput for Content-Downloading Applications," IEDM 2001, 2.2.1-2.2.4.

Naruke, K., et al., "Nonvolatile Semiconductor Memories: Technologies, design and application," C. Hu. Ed., New York, IEEE Press, 1991, Ch. 5, pp. 183-186.

Tsai, Wen Jer et al., U.S. Appl. No. 10/289,866, filed Nov. 6, 2002, entitled "Erasing Method for Non-Volatile Memory," 24 pages.

Bude, J.D., et al. "Secondary Electron Flash—a High Performance, Low Power Flash Technology for 0.35 μm and Below," Electron Devices Meeting, 1997. Technical Digest., International , Dec. 7-10, 1997, 279-282.

Chung, Steve S., "Low Voltage/Power and High Speed Flash Memory Technology for High Performance and Reliability," The 3rd WIMNACT—Singapore, Oct. 15, 2003, 1-48.

Chung, Steve S., et al., "A Novel Leakage Current Separation Technique in a Direct Tunneling Regime Gate Oxide SONOS Memory Cell," Electron Devices Meeting, 2003. IEDM '03 Technical Digest. IEEE International , Dec. 8-10, 2003 pp. 26.6.1-26.6.4.

De Blauwe, Jan, "Nanocrystal Nonvolatile Memory Devices," IEEE Transactions on Nanotechnology, vol. 1, No. 1, Mar. 2002, 72-77.

Eitan, Boaz, et al. "NROM: A Novel Localized Trapping, 2-Bit Nonvolatile Memory Cell," IEEE Electron Device Letters, vol. 21, No. 11, Nov. 2000, 543-545.

Hirose, M., "Challenges for Future Semiconductor Development," Microprocesses and Nanotechnology Conference, 2002. Digest of Papers. Microprocesses and Nanotechnology 2002. 2002 International, Nov. 6-8, 2002, p. 2-3, pluse 24 pages from outline.

Janai, Meir, "Data Retention, Endurance and Accelaration Factors of NROM Devices," IEEE 41st Annual International Reliability Physics Symposium, Dallas, Texas, 2003, 502-505.

Lee, Chang Hyun, et al. "A Novel SONOS Structure of SiO2/SiN/Al2O3 with TaN Metal Gate for Multi-Giga Bit Flash Memeries," Electron Devices Meeting, 2003. IEDM '03 Technical Digest. IEEE International . Dec. 8-10, 2003, 26.5.1-26.5.4.

Lee, Changhyun, et al., "A Novel Structure of SiO2/SiN/High k Dielectrics, Al2O3 for SONOS Type Flash Memory," Extended Abstracts of the 2002 International Conference on Solid State Devices and Materials, Sep. 17-19, 2002, Nagoya, 162-163.

Lee, Jae-Duk, et al., "Effects of Floating-Gate Interference on NAND Flash Memory Cell Operation," IEEE Electron Device Letters, vol. 23, No. 5, May 2002, 264-266.

Liu, Zhizheng et al., "A New Programming Technique for Flash Memory Devices," International Symposium on VLSI Technology, Systems and Applications, Jun. 8-10, 1999, 195-198.

Huff, H.R. and Bevan, M., assemblers, "Questions at the International Workshop on Gate Insulators," Ad Hoc Meeting on High-k Gate Dielectrics at the Semiconductor Interface Specialists Conference, Nov. 30, 2001, 3 pages.

Shin, Yoocheol, et al., "High Reliable SONOS-type NAND Flash Memory Cell with Al2O3 for Top Oxide," Non-Volatile Semiconductor Memory Workshop, 2003, 2 pages.

Tsai, W.J., et al., "Data Retention Behavior of a SONOS Type Two-Bit Storage Flash Memory Cell," Electron Devices Meeting, 2001. IEDM Technical Digest. International , Dec. 2-5, 2001 pp. 32.6.1-32.6.4.

Wang, Tahui, et al., "Reliability Models of Data Retention and Read-Disturb in 2-bit Nitride Storage Flash Memory Cells," Electron Devices Meeting, 2003. IEDM '03 Technical Digest. IEEE International , Dec. 8-10, 2003, pp. 7.4.1-7.4.4.

White, Marvin, H., et al., "On the Go with SONOS," Circuits and Devices Magazine, IEEE, vol. 16, Issue: 4, Jul. 2000, pp. 22-31.

Yeh, C.C., et al., "Novel Operation Schemes to Improve Device Reliability in a Localized Trapping Storage SONOS-type Flash Memory," Electron Devices Meeting, 2003. IEDM '03 Technical Digest. IEEE International, Dec. 8-10, 2003, pp. 7.5.1-7.5.4.

Yeh, C.C., et al., "PHINES: A Novel Low Power Program/Erase, Small Pitch, 2-Bit per Cell Flash Memory," Electron Devices Meeting, 2002. IEDM '02. Digest. International, Dec. 8-11, 2002, pp. 931-934.

Eitan, Boaz, "Can NROM, a 2-bit, Trapping Storage NVM Cell, Give a Real Challenge to Floating Gate Cells?" SSDM, Tokyo, Japan (1999), 3 pages.

Lusky, Eli et al., "Electron Discharge Model of Locally-Trapped Charge in Oxide-Nitride-Oxide (ONO) Gates for NROM Non-Volatile Semiconductor Memory Devices," SSDM, Tokyo, Japan (Sep. 2001), 2 pages.

Lusky, Eli et al., "Spatial characterization of Channel hot electron injection Utilizing subthreshold slope of the localized charge storage NROM memory device," Non-Volatile Semiconductor Memory Workshop. Monterey, CA (Aug. 2001) 2 pages.

U.S. Appl. No. 11/118,839, filed Apr. 29, 2005, "Inversion Bit Line, Charge Trapping Non-Volatile Memory And Method of Operating Same," 34 pages.

Lauri, S.K., "MNOS/Floating-Gate Charge Coupled Devices for High Density EEPROMS: A New Concept", Physics of Semiconductor Devices, Dec. 1997, pp. 951-956, vol. 3316, No. 2.

* cited by examiner

INVERSION BIT LINE, CHARGE TRAPPING NON-VOLATILE MEMORY AND METHOD OF OPERATING SAME

BACKGROUND OF THE INVENTION

1. Field of the Invention

The present invention relates to electrically programmable and erasable, nonvolatile memory, and more particularly to such memory based on charge trapping memory cells.

2. Description of Related Art

Electrically programmable and erasable non-volatile memory technologies based on charge storage structures known as EEPROM and flash memory are used in a variety of modern applications. A number of memory cell structures are used for EEPROM and flash memory. As the dimensions of integrated circuits shrink, greater interest is arising for memory cell structures based on charge trapping dielectric layers, because of the scalability and simplicity of the manufacturing processes. Memory cell structures based on charge trapping dielectric layers include structures known by the industry names NROM, SONOS, and PHINES, for example. These memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

Conventional SONOS devices use ultra-thin bottom oxide, e.g. less than 3 nanometers, and a bias arrangement that causes direct tunneling for channel erase. Although the erase speed is fast using this technique, the charge retention is poor due to the charge leakage through ultra-thin bottom oxide.

NROM devices use a relatively thick bottom oxide, e.g. greater than 3 nanometers, and typically about 5 to 9 nanometers, to prevent charge loss. Instead of direct tunneling, band-to-band tunneling induced hot hole injection BTBTHH can be used to erase the cell. However, the hot hole injection causes oxide damage, leading to charge loss in the high threshold cell and charge gain in the low threshold cell. Moreover, the erase time must be increased gradually during program and erase cycling due to the hard-to-erase accumulation of charge in the charge trapping structure. This accumulation of charge occurs because the hole injection point and electron injection point do not coincide with each other, and some electrons remain after the erase pulse. In addition, during the sector erase of an NROM flash memory device, the erase speed for each cell is different because of process variations (such as channel length variation). This difference in erase speed results in a large threshold voltage Vt distribution of the erase state, where some of the cells become hard to erase and some of them are over-erased. Thus the target Vt window is closed after many program and erase cycles and poor endurance is observed. This phenomenon will become more serious when the technology keeps scaling down.

One limitation on the size of traditional memory cells arises from the use of diffusion lines in semiconductor substrates for source and drain terminals. The diffusion of impurities used to form the diffusion lines spreads out slightly beyond the locations in which the implant is made, increasing the size of the diffusion region, and making it difficult to shrink to smaller and smaller minimum dimensions, and causing other limitations on cell size, including minimum channel lengths for prevention of punch-through.

One approach to overcoming the problems with use of diffusion lines has been developed bases on induction of conductive inversion regions in the substrate using control electrodes adjacent to the charge storage structure in the memory cell, which act as source and drain terminals. Because there are no implants, the dimensions of the inversion regions can be more precisely controlled according to the minimum feature sizes of the manufacturing process. See, Sasago et al., "90-nm-node multi-level AG-AND type flash memory with cell size of true $2F^2$/bit and programming throughput of 10 MB/s," IEDM, 2003, pages 823–826 and United States Patent Application Publication No. US 2004/0084714 by Ishii et al. However, practical implementations of inversion bit line based memory devices have not been reported in the literature, based on charge trapping memory cells.

SUMMARY OF THE INVENTION

An inversion bit line charge trapping memory cell is described which has no implanted source and drain bit lines. Rather, a field induced inversion layer is used to replace the source and drain implants. As a result the memory cell is more easily scaled to smaller dimensions. Embodiments of the memory cell are adapted to store two bits, one on the left side and one on the right side of the charge trapping structure. A positive threshold voltage erase state is described for embodiments of the memory cell using negative gate voltage Fowler Nordheim FN tunneling which establishes a charge balance condition at a positive voltage, permitting over-erase problems. A low current, source side, hot electron injection programming method is described for embodiments of the memory cell, which is suitable for use with inversion bit lines, and achieves low current high-speed programming for both left and right side of the memory cells.

An integrated circuit memory according to the technology described herein comprises a semiconductor body, plurality of word lines overlying the semiconductor body, and an array of memory cells between the plurality of word lines in the semiconductor body. The array of memory cells includes at least one sector supporting sector erase operations. The memory cells in the array include respective control gates contacting word lines in the plurality of word lines, and charge trapping structures between the control dates and the semiconductor body. A plurality of current control lines are arranged generally orthogonally with respect to the plurality of word lines, between columns of memory cells in the array. The current control lines overlie the semiconductor body, and are arranged to induce inversion bit lines in the semiconductor body in response to bias voltages applied to the current control lines. The inversion bit lines provide source and drain terminals for the memory cells during program, erase and read operations.

Control circuitry is included with the integrated circuit memory in embodiments of the invention. The control circuitry is coupled to the plurality of current control lines, the plurality of word lines and the semiconductor body, and applies biasing arrangements for programming and erasing data by charge storage in the memory cells, and for reading the stored data. A biasing arrangement for programming a bit of data on the left side of a memory cell is described, which induces source side hot electron injection on the left side of the charge trapping structure via the inversion bit lines to establish a high threshold state for reads of the left side. A biasing arrangement for programming a bit of data on the right side of the memory cell is described as well, which induces source side hot electron injection on the right side of the charge trapping structure via the inversion bit lines. A biasing arrangement for erasing data in a sector of the array induces charge balancing, by applying a negative voltage between police one word line coupled to the memory cells in the sector in the semiconductor body that is sufficient to induce FN tunneling between the charge trapping structure and the semiconductor body balanced by FN tunneling between the control gate and the charge trapping structure, until a target low threshold voltage is established in the memory cells in the sector. A biasing arrangement for reading a bit of data is also described which induces inversion bit lines on the left and right sides of the memory cells, and applies a read bias voltage to word lines that are coupled to the control gates of the particular memory cells.

The charged balance state for embodiments of the memory cell achieved by the erase process results in a target low threshold voltage that is positive, and greater than two volts in some embodiments, and more preferably greater than three volts and other embodiments. The memory cells are engineered in some embodiments to adjust the magnitude of the target low threshold voltage. For example, relatively high work function materials, such as p-type polysilicon, can be used as the control gates in order to reduce the magnitude of the charged balanced state.

Technology is also embodied by a method for operating an integrated circuit memory, like that described above. According to an embodiment described herein, the method comprises applying a biasing arrangement for programming a bit of data on a left side of a particular memory cell in the array to induce source side hot electron injection on the left side of the charge trapping structure via inversion bit lines to establish a high threshold state for reads of the left side;

applying a biasing arrangement for programming a bit of data on a right side of the particular memory cell in the array to induce source side hot electron injection on the right side of the charge trapping structure via inversion bit lines to establish a high threshold state for reads of the right side;

applying a biasing arrangement for erasing a data in the at least one sector including inducing charge balancing, by applying a negative voltage between at least one word line coupled to the memory cells in the sector and the semiconductor body and, sufficient to induce FN tunneling between the charge trapping structure and the semiconductor body balanced by FN tunneling between the control gate and the charge trapping structure, until a target low threshold voltage is established in the memory cells in the sector; and applying a biasing arrangement for reading a bit of data on a left side of a particular memory cell in the array to induce relatively conductive inversion bit lines on the left and right sides of the particular memory cell and applies a read bias voltage to the word line coupled to the control gate of the particular memory cell.

Likewise, embodiments of the invention include a biasing arrangement for programming data by inversion bit line induced source side hot electron injection. One embodiment described herein for programming a bit of data on one side of the left and right sides of the particular memory cell includes applying a body bias voltage to the semiconductor body, applying a program voltage to a word line coupled to the particular memory cell and to other memory cells coupled to the word line including a second memory cell to the one side, applying first bias voltage to a first current control line adjacent to the particular memory cell on the other side of the left and right sides, sufficient to induce a relatively conductive inversion bit line beneath the first current control line forming a drain terminal for the particular memory cell, and coupling a drain voltage to the drain terminal via the inversion bit line beneath the first current control line, applying a second bias voltage to a second current control line sufficient to induce a relatively resistive inversion bit line beneath the second current control line adjacent to the particular memory cell on the one side, and applying a third bias voltage to a third current control line sufficient to induce a relatively conductive inversion bit line beneath the third current control line adjacent to the second memory cell on the one side, forming a source terminal for the particular memory cell, and coupling a source voltage to the source terminal via the inversion bit lines beneath the second and third current control lines.

In addition, a biasing arrangement for reading a bit of data using inversion bit lines is described. One embodiment of the biasing arrangement for reading a bit of data on one side of the left and right sides of the particular memory cell includes applying a read voltage to a word line coupled to the particular memory cell;

applying first bias voltage to a first current control line adjacent to the particular memory cell on the other side of the left and right sides, sufficient to induce a relatively conductive inversion bit line beneath the first current control line forming a drain terminal for the particular memory cell, and coupling a drain voltage to the drain terminal via the inversion bit line beneath the first current control line, applying a second bias voltage to a second current control line adjacent to the particular memory cell on the one side of the left and right sides, sufficient to induce a relatively conductive inversion bit line beneath the second current control line forming a source terminal for the particular memory cell, and coupling a source voltage to the source terminal via the inversion bit line beneath the second current control line.

Memory technology described herein achieves significant advantages over the prior art. The memory is easy to scale to smaller minimum dimensions than conventional charge trapping memory cells or cells based on floating gate technology because of the elimination of buried source and drained diffusion regions. The cell size can be very small because problems with punch-through that arise with diffusion source and drain regions are eliminated. Programming speed is faster than conventional charge trapping memory cells in embodiments of the technology that use inversion bit line induced low current source side injection. The erase algorithm in embodiments of the technology described is simple and fast, implementing a positive erase threshold state. Memory technology described herein supports two bits per cell for high-density arrays. Furthermore, the memory technology avoids problems with data retention that arise in prior art charge trapping structures that generate hot holes during operation.

Other aspects and advantages of the present invention can be seen on review of the drawings, the detailed description and the claims, which follow.

DETAILED DESCRIPTION

A detailed description of embodiments of the present invention is provided with reference to the FIGS. 1–16.

Figure 1:
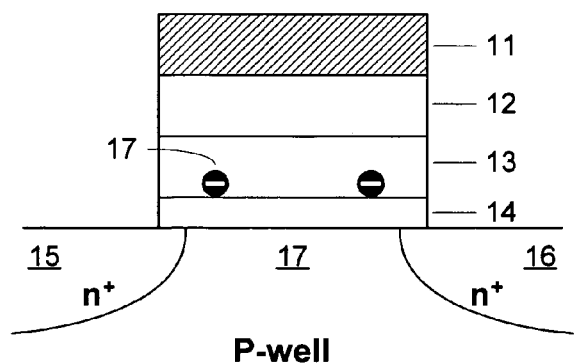
FIG. 1 is a simplified diagram of a charge trapping memory cell with buried diffusion source and drain terminals as known in the prior art.

FIG. 1 is a simplified diagram of a charge trapping memory cell of the prior art. The substrate includes n+ doped regions 15 and 16, and a p-doped region 17 between the n+ doped regions 15 and 16. The n+ doped regions 15 and 16 provide diffusion lines that act as source and drain terminals. The remainder of the memory cell includes a charge trapping structure including a bottom dielectric 14 on the substrate, a charge trapping layer 13 on the bottom dielectric 14 (bottom oxide), a top dielectric 12 (top oxide) on the charge trapping layer 13, and a control gate 11 on the top dielectric 12. Typically, the control gate 11 comprises n-type polysilicon, and is coupled to a word line (not shown). The charge trapping structure has trapped charge in the charge trapping layer 13 such as represented by electron 17. Typically, such cells are erased by band-to-band tunneling induced hot hole injection, and achieve a low threshold state that is less than 1 volt, and even lower, as represented generally by the small number of electron symbols in the drawing. Also, although the diffusion regions are self-aligned during the implant process with the edges of the control gate 11, the impurities diffuse under the edges of the charge trapping structure, narrowing the channel and limiting scaling of the devices to smaller dimensions.

Figure 2:
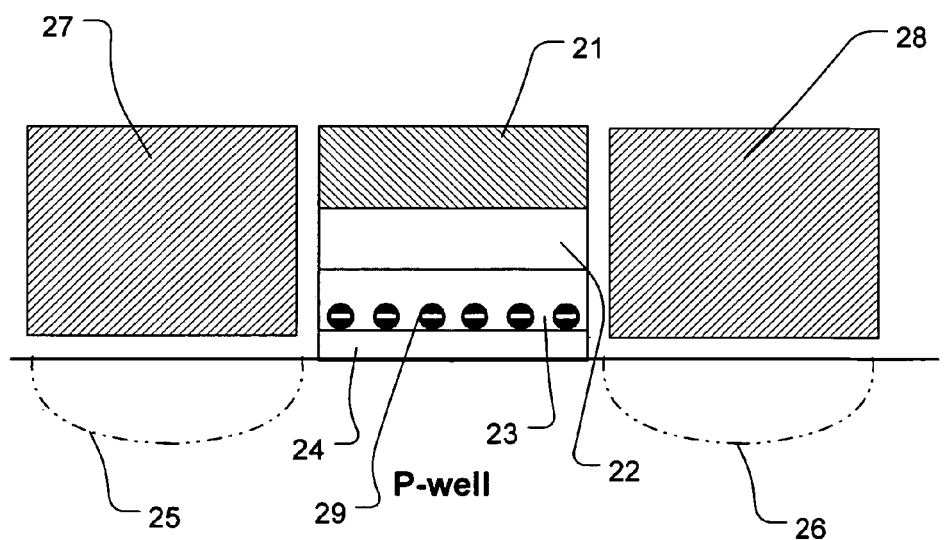
FIG. 2 is a cross-section of a charge trapping memory cell with inversion bit line structures acting as source and drain terminals.

FIG. 2 Illustrates a memory cell including inversion bit lines in the semiconductor body such as the p-type well illustrated in figure. The inversion bit lines provide a source terminal 25 and a drain terminal 26, in response to bias voltages applied to corresponding current control lines 27 and 28. Memory cell includes a charge trapping structure including a bottom dielectric 24 on the substrate, a charge trapping layer 23 on the bottom dielectric 24 (bottom oxide), a top dielectric 22 (top oxide) on the charge trapping layer 23, and a control gate 21 on the top dielectric 22. The control gate 21 comprises p-type polysilicon in the illustrated embodiment, while the current control lines 27 and 28 comprise n-type polysilicon. The p-type polysilicon has a higher work function, and when used for the control gate affects the charge balanced threshold state is induced by FN tunneling, as described in more detail below. The n-type polysilicon has greater conductivity, and is suitable for use as the current control line material. The control gate 21 coupled to a word line (not shown), which extends in a line generally orthogonal to the current control lines 27 and 28, and is coupled to a plurality of memory cells along a row in the array. The charge trapping structure has trapped charge in the charge trapping layer 21 such as represented by electron 29. The relatively larger number of electron symbols in the figure is intended to convey that the low threshold state achieve by the charge balancing FN tunneling as described in more detail below is slightly positive relative to that achieved in the prior art.

Representative top dielectrics include silicon dioxide and silicon oxynitride having a thickness of about 5 to 10 nanometers, or other similar high dielectric constant materials including for example $Al_2O_3$. Representative bottom dielectrics include silicon dioxide and silicon oxynitride having a thickness of about 3 to 10 nanometers, or other similar high dielectric constant materials. Representative charge trapping structures include silicon nitride having a thickness of about 3 to 9 nanometers, or other similar high dielectric constant materials, including metal oxides such as $Al_2O_3$, $HfO_2$, and others. The charge trapping layer may be a discontinuous set of pockets or particles of charge trapping material, or a continuous layer as shown in the drawing.

In some embodiments, the gate comprises a material having a work function greater than the intrinsic work function of n-type silicon which is about 4.1 eV, and preferably greater than about 4.25 eV, including for example greater than about 5 eV. Representative gate materials include p-type poly, TiN, Pt, and other high work function metals and materials. Other materials having a relatively high work function suitable for embodiments of the technology include metals including but not limited to Ru, Ir, Ni, and Co, metal alloys including but not limited to Ru—Ti and Ni-T, metal nitrides, and metal oxides including but not limited to $RuO_2$. High work function gate materials result in higher injection barriers for electron tunneling than that of the typical n-type polysilicon gate. The injection barrier for n-type polysilicon gates with silicon dioxide as the top dielectric is around 3.15 eV. Thus, embodiments of the present technology use materials for the gate and for the top dielectric having an injection barrier higher than about 3.15 eV, such as higher than about 3.4 eV, and preferably higher than about 4 eV.

Figure 3:
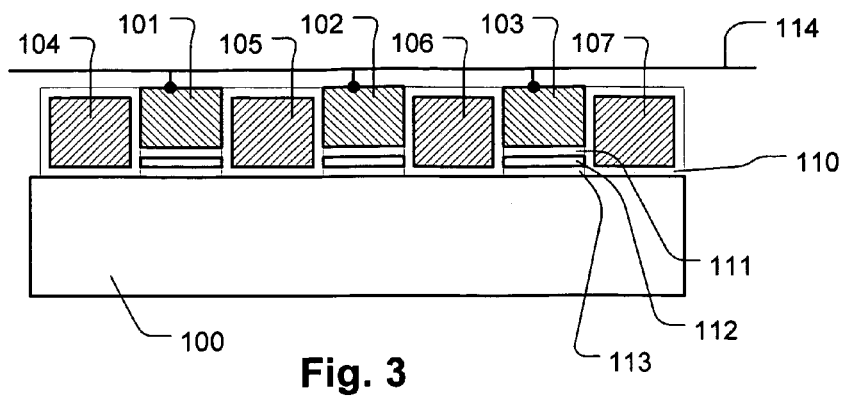
FIG. 3 is a cross-section of a row of inversion bit line memory cells according to an embodiment of the invention.

FIG. 3 is a cross-section of a row of memory cells formed on a semiconductor body 100. The memory cells have control gates 101, 102, 103 overlying charge trapping structures that include a top dielectric 111, the charge trapping layer 112, and a bottom dielectric 113. Current control lines 104–107 overlie the semiconductor body 100, and extend between the memory cells in the row, along columns in a memory array. In the illustrated embodiment, the control gates 101, 102, 103 comprise p-type polysilicon. The current control lines 104–107 comprise n-type polysilicon, or other conductive materials. The current control lines 104–107 are isolated from the semiconductor body 100 in the illustrated embodiment, and from the memory cells by dielectric 110, such as silicon dioxide. The structure illustrated in FIG. 3 can be implemented by first forming the memory cell stacks (control gate 103, top dielectric 111, charge trapping layer 112, and bottom dielectric 113) on the semiconductor body, forming a dielectric 110 between them memory cells, and then patterning the current control lines 104–107. The control gates 101–103 are not covered by dielectric in the figure, as they are adapted for contacting a wordline, represented by line 114 which extends orthogonal to the current control lines. Wordlines can be implemented using polysilicon, metal, silicides, other conductive materials and combinations of materials.

Figure 4:
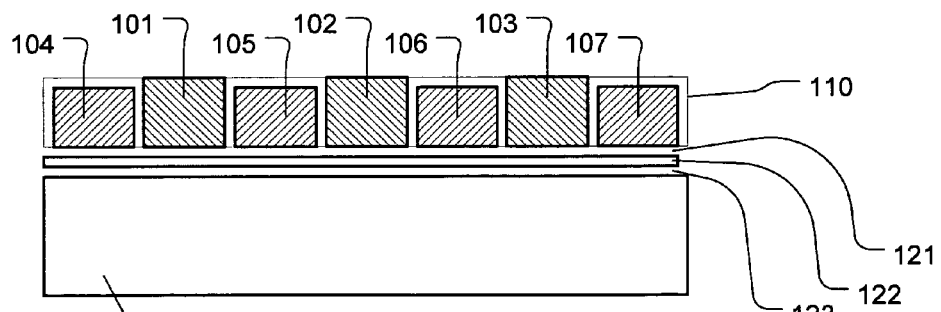
FIG. 4 is a cross-section of a row of inversion bit line memory cells according to another embodiment of the invention.

FIG. 4 is a cross-section of an alternative embodiment of a row of memory cells. Reference numerals used in FIG. 3 are applied again in FIG. 4 for like structures. The only difference in structure is the implementation of the charge trapping structures for the memory cells including top dielectric 121, charge trapping layer 122, and bottom dielectric 123 which extend beneath the current control lines 104–107, as well as beneath the control gates 101–103. The process of manufacturing the structure of FIG. 4 would involve first forming the stack of top dielectric 121, charge trapping layer 122 and bottom dielectric 123 across the semiconductor body 100. Next, current control lines 104–107 are patterned and isolated by dielectric 110. Then, control gates 101–103 are formed between the current control lines and coupled to a wordline (not shown).

Figure 5:
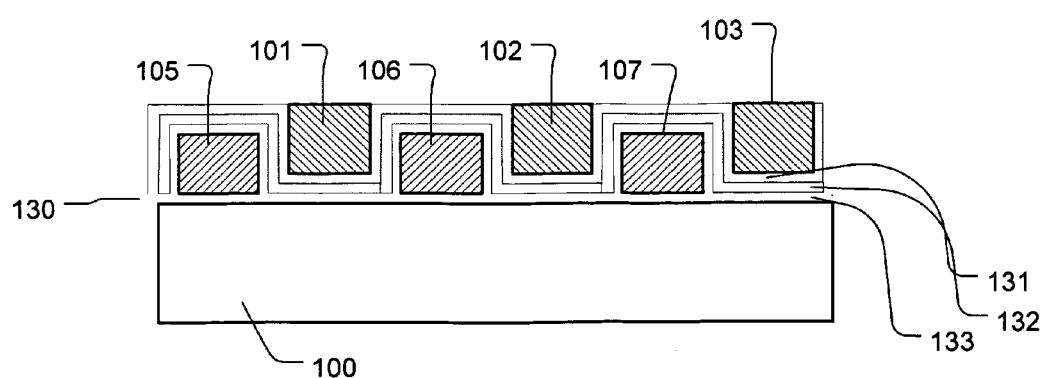
FIG. 5 is a cross-section of a row of inversion bit line memory cells according to yet another embodiment of the invention.

FIG. 5 is a cross-section of an another alternative embodiment of a row of memory cells. Reference numerals used in FIG. 3 are applied again in FIG. 5 for like structures. The only difference in structure is the implementation of the charge trapping structures for the memory cells including top dielectric 131, charge trapping layer 132, and bottom dielectric 133 are continuous across the array and extend beneath the control gates 101–103, and between the control gates 101–103 and the current control lines 105–107, and over the current control lines 105–107. The process of manufacturing the structure of FIG. 4 would involve first forming the current control lines 104–107 are patterned and isolated by dielectric 130 from the semiconductor body 100. Next, the stack of top dielectric 121, charge trapping layer 122 and bottom dielectric 123 is formed over the semiconductor body 100 and the current control lines 105–107. Then, control gates 101–103 are formed between the current control lines and coupled to a wordline (not shown).

Figure 6:
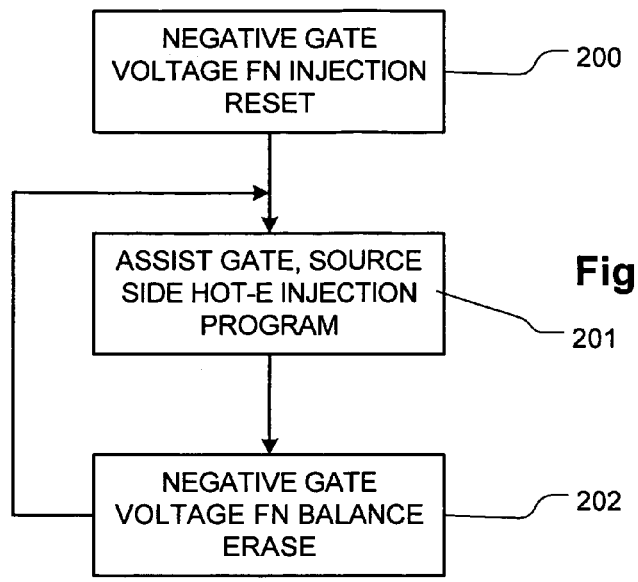
FIG. 6 illustrates the basic program an erase cycling operation for an embodiment of the invention.

A basic operation procedure for a memory cell implemented as described above is shown in FIG. 6. In order to establish a relatively positive erase state, after manufacture the memory array is reset by a negative gate voltage, FN injection procedure that establishes a charge balanced low threshold state (block 200). For programming, and assist gate, source side hot electron injection buys procedure is applied (block 201). For erase, a negative gate voltage FN charge balanced injection, which is similar to the reset operation of block 200, is performed (block 202). Thus the basic program an array cycle is shown in FIG. 6.

Figure 7:
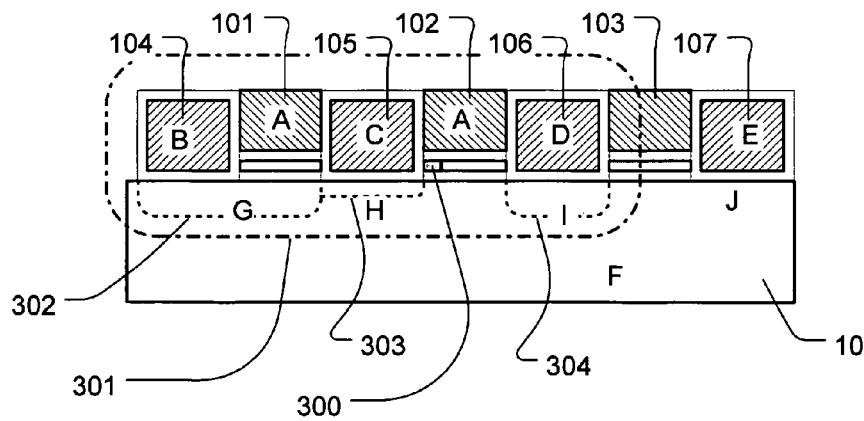
FIG. 7 illustrates a biasing arrangement for programming a bit on a left side of a charge trapping memory cell in an embodiment of the invention.

The programming biasing arrangements for the left side bit of a memory cell and for the right side bit of a memory cell are described with reference to FIGS. 7 and 8, respectively, for an embodiment of the technology. In FIG. 7, programming of the left side bit 300 is illustrated. The region 301 encompassing the particular memory cell including bit 300 and the memory cell to the left, is biased to induce source side, assist gate, hot electron injection. The control gates 101, 102 are coupled to a wordline receiving the bias voltage A. The current control lines 104, 105, 106 receive the bias voltages B, C and D respectively. The semiconductor body 100 receives the bias voltage F. The current control lines 104, 105, 106 receive bias voltages B, C and D, in order to induce inversion bit lines. Inversion bit line 302 induced by current control line 104 receives the bias voltage G. Inversion bit line 303 induced by current control line 105 receives the bias voltage H. Inversion bit line 304 induced by current control line 106 receives the bias voltage I. The current control line 107 receives the bias voltage E and the induced inversion bit line, if any, receives the bias voltage J. The bias voltages G, H, J and I other applied to the inversion bit lines, are coupled to the semiconductor body via column select transistors in the array, and are conducted to the particular memory cells being accessed by inversion bit lines. Likewise, the bias voltages B, C, D, and E are coupled to the current control lines by column select transistors in the array. The bias voltage A is carried by wordlines.

Representative bias voltages for programming the left bit 300 to a high threshold state are set forth in the following list:

A: 12–16 V
B: 4–6 V
C: 0.7–1 V
D: 7–9 V
E: 0 V
F: 0 V
G: 0 V
H: Floating
I: 4–6 V
J: 0 V As a result of the biasing arrangement set forth above, the relatively conductive inversion bit line 302 is induced beneath the current control line 104 and the control gate 101 of the cell on the left of the memory cell including bit 300, and coupled to ground. A relatively resistive inversion bit line 303 is induced under the current control line 105. The combination of the inversion bit lines 302 and 303 provide a source terminal for the programming operation. Relatively conductive inversion bit line 304 is induced under the current control line 106, and act as a drain terminal for the programming operation.

Figure 8:
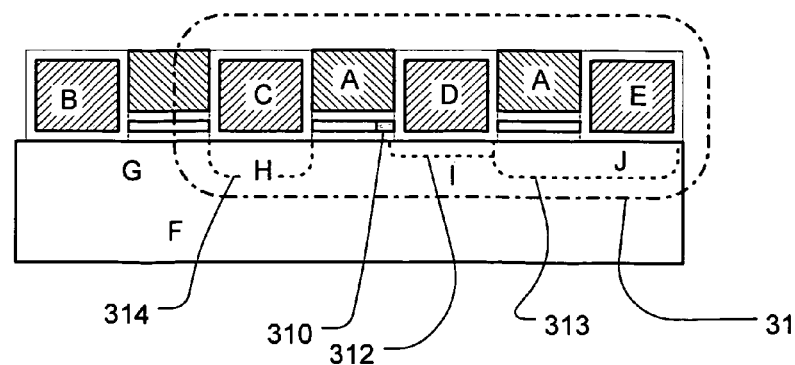
FIG. 8 illustrates a biasing arrangement for programming a bit on a right side of a charge trapping memory cell in an embodiment of the invention.

FIG. 8 illustrates the biasing arrangement for programming a right bit 310 in the particular memory cell within the region 311. The region 311 encompasses the particular memory cell including bit 310 and the memory cell to the right, and is biased to induce source side, assist gate, hot electron injection. The control gates are coupled to a wordline receiving the bias voltage A. The current control lines in region 311 receive the bias voltages C, D and E respectively. The semiconductor body receives the bias voltage F. The current control lines in region 311 receive bias voltages C, D and E, in order to induce inversion bit lines. Inversion bit line 312 induced by a current control line that receives the bias voltage I. Inversion bit line 313 induced by a current control line that receives the bias voltage J. Inversion bit line 314 induced by a current control line that receives the bias voltage H. The current control line outside the region 311 in FIG. 8 receives the bias voltage B, and the region of its induced inversion bit line, if any, receives the bias voltage G.

Representative bias voltages for programming the right bit 310 to a high threshold state are set forth in the following list:
- A: 12–16 V
- B: 0 V
- C: 7∫9 V
- D: 0.7–1 V
- E: 4–6 V
- F: 0 V
- G: 0 V
- H: Floating
- I: 4–6 V
- J: 0 V The biasing arrangement illustrated in FIG. 8, for programming the right side bit 310, is the opposite of that discussed above for programming the left side bit 301 of the particular memory cell.

Figure 9:
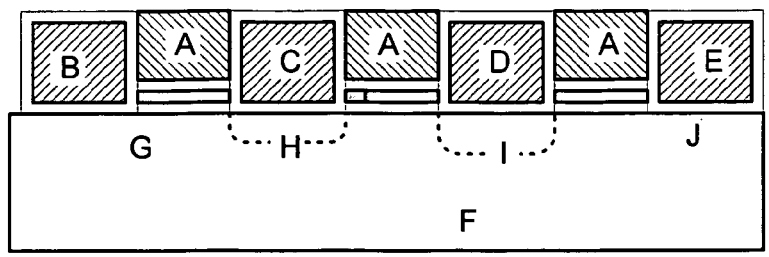
FIG. 9 illustrates a biasing arrangement for reading a bit on a left side of a charge trapping memory cell in an embodiment of the invention.

Representative bias voltages for reading the left bit 301 in a particular memory cell as illustrated in FIG. 9, are set forth in the following list:
- A: 2–5 V
- B: 0 V
- C: 4∫6 V
- D: 4–6 V
- E: 0 V
- F: 0 V
- G: 0 V
- H: 0 V
- I: 1–3 V
- J: 0 V In this read biasing arrangement results in formation of inversion bit lines under the current control line receiving the bias voltage C which acts as a source terminal during the read operation, and in inversion bit line under the current control line receiving the bias voltage D, which acts as a drain in the read operation. The voltage level A on the control gates is set between the target low threshold state, and the target high threshold state.

Figure 10:
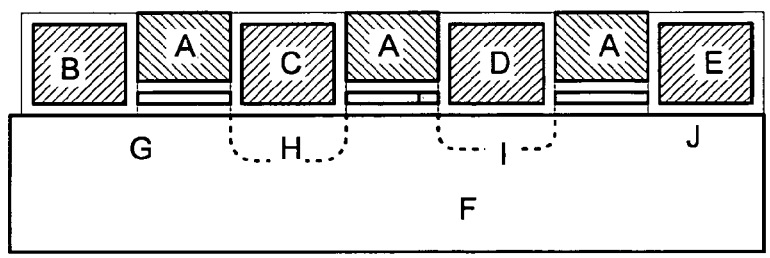
FIG. 10 illustrates a biasing arrangement for reading a bit on a right side of a charge trapping memory cell in an embodiment of the invention.

Representative bias voltages for reading the right bit 310 in a particular memory cell as illustrated in FIG. 10, are set forth in the following list:
- A: 2–5 V
- B: 0 V
- C: 4∫6 V
- D: 4–6 V
- E: 0 V
- F: 0 V
- G: 0 V
- H: 1–3 V
- I: 0 V
- J: 0 V Thus, to read the right bit 310, the inversion bit line under current control line receiving the bias voltage C acts as the drain, and the inversion bit line under the current control line receiving the bias voltage D acts as the source.

Figure 11:
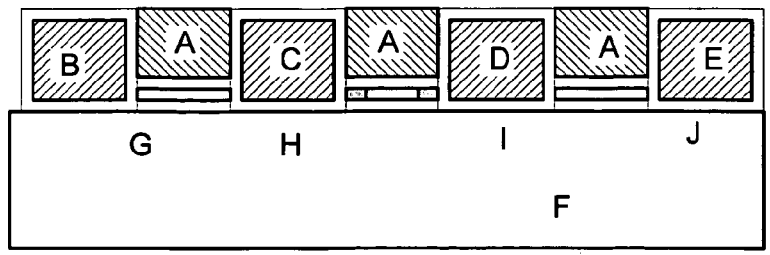
FIG. 11 illustrates a biasing arrangement for erasing data in charge trapping memory cell in an embodiment of the invention.

A biasing arrangement for erase, and for the reset operation which occurs prior to programming, is described with reference to FIG. 11. As can be seen, there are no inversion bit lines involved in the FN erase and reset process. Representative bias voltages for erase for all the memory cells along a wordline, or in a sector of the array, are set forth in the following list:
- A: −10–−15 V
- B: Floating
- C: Floating
- D: Floating
- E: Floating
- F: 5 to 10 V
- G: Floating
- H: Floating
- I: Floating
- J: Floating In an alternative, A is set to −15 to −20 V and F is set to ground (0 V).

Thus, in this erase bias arrangement, a potential of −15 to −25 V is placed between the control gates of the memory cells in sector of the array and the semiconductor body for the sector. This bias arrangement tends to balance the charge distribution in the charge trapping structure, by removing excess electrons in regions in which the electrons have built up during program and erase cycling, and by inducing both electron injection current from the control gate to the charge trapping layer and electron ejection current from the charge trapping structure to the semiconductor body, which reaches a dynamic balance or equilibrium after sufficient time, in which the threshold voltage of the memory cell is converged on a target threshold, and which results in a balanced distribution of charge across the length of the channel. This bias arrangement is substantially symmetrical across the memory cell.

Figure 12:
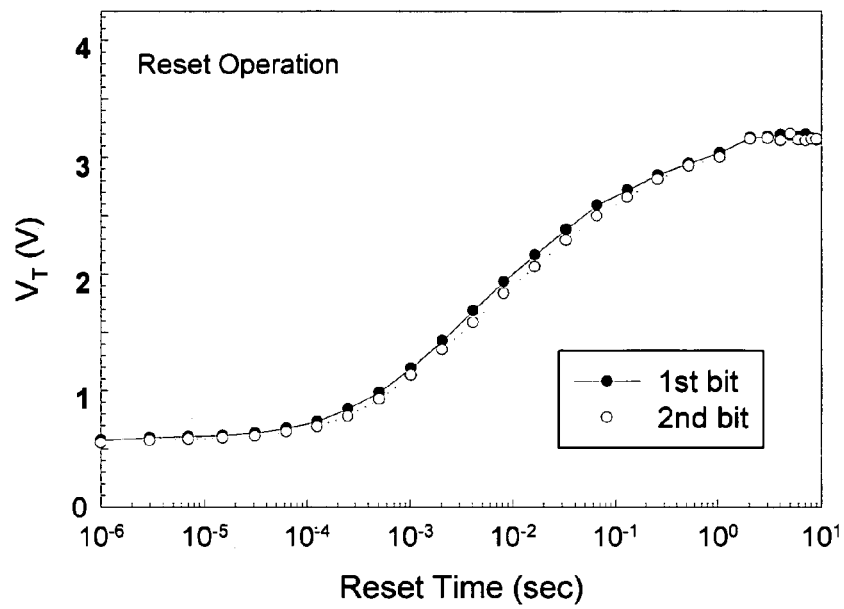
FIG. 12 is a graph of threshold voltage Vt versus time for a charge balancing reset operation.

FIG. 12 is a graph showing performance of the reset operation, corresponding to step 200 of FIG. 6. Prior to the reset operation, the threshold voltage of memory cells without charge trapping is less than one volt. After applying a reset operation for about one to 10 seconds, with a bias voltage of about −20 V, the target low threshold voltage is slightly over three volts. As can be seen, both the first and second bits are reset at the same time.

Figure 13:
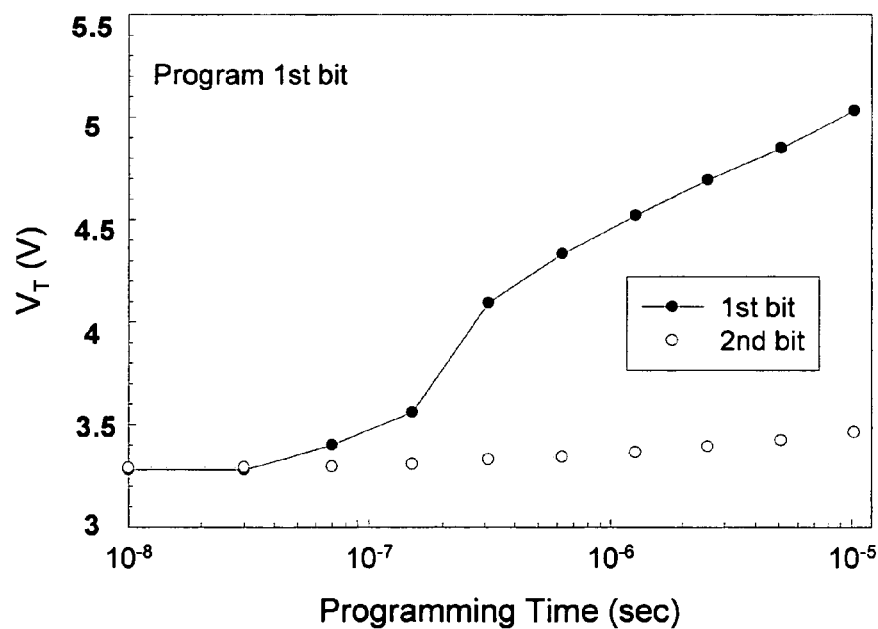
FIG. 13 is a graph of threshold voltage Vt versus time for a programming operation for a first bit of a memory cell.

FIG. 13 is a graph showing performance of programming one bit, such as a left-hand bit in the memory cell. As shown, for a memory cell starting with a erase state threshold of about 3.2 volts, and inducing source side hot electron injection as described above, the first bit has a threshold of about five volts after about 10 microseconds. The other bit in the memory cell, initially at a low threshold state, is substantially unaffected.

Figure 14:
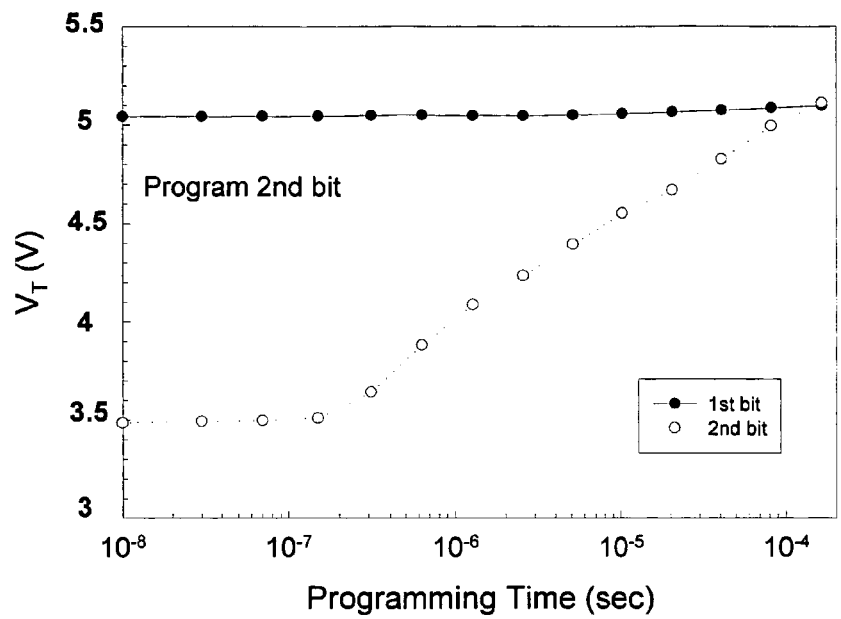
FIG. 14 is a graph of threshold voltage Vt versus time for a programming operation for a second bit of a memory cell.

FIG. 14 is a graph showing performance of programming one bit, such as a right-hand bit after programming the left-hand bit in the memory cell. As shown, for a bit in the memory cell starting with a erase state threshold of about 3.2 volts, and inducing source side hot electron injection as described above, the second bit has a threshold of about five volts after about 10 microseconds. The other bit in the memory cell, initially at a high threshold state, is substantially unaffected.

Figure 15:
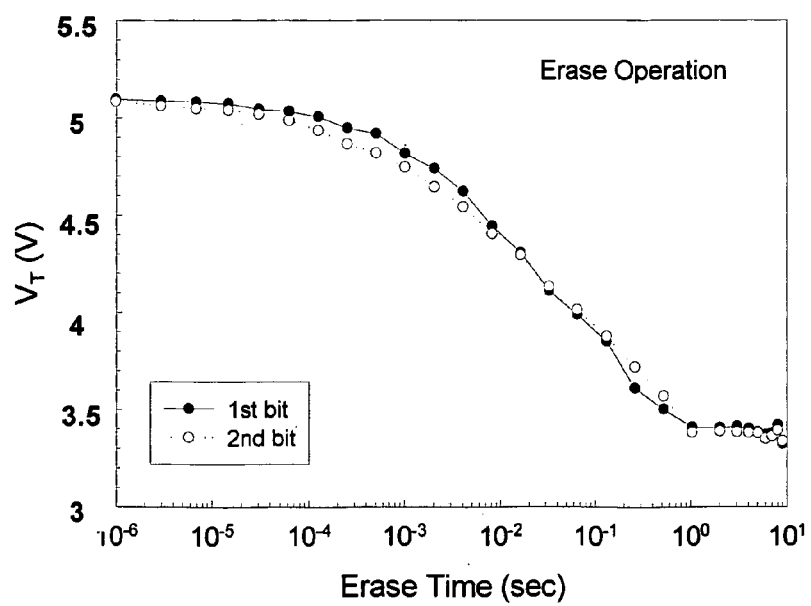
FIG. 15 is a graph of threshold voltage Vt versus time for an erasing operation for a memory cell.

FIG. 15 is a graph showing performance of the erase operation for a cell having two programmed bits. Prior to the erase operation, the threshold voltage of both bits in the memory cell is about 5.1 V. After applying a reset operation for about one to 10 seconds, with a bias voltage of about −20 V, the target low threshold voltage is about 3.4 V. As can be seen, both the first and second bits are erased at the same time. Because the erase is executed on sector boundaries, the per cell erase time can be quite low.

Figure 16:
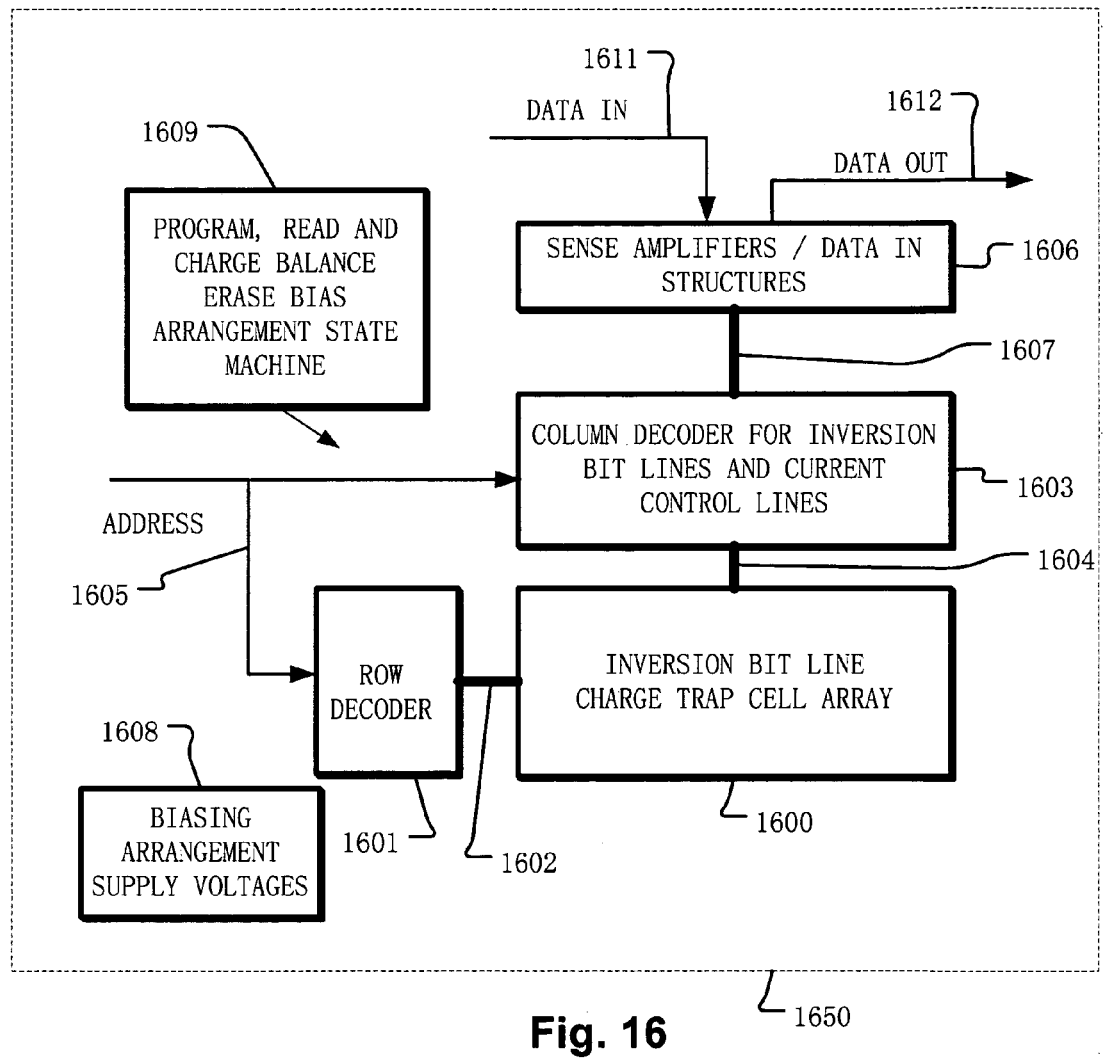
FIG. 16 is a simplified block diagram of an integrated circuit memory including technology described herein.

FIG. 16 is a simplified block diagram of an integrated circuit according to an embodiment of the present invention. The integrated circuit 1650 includes a memory array 1600 implemented using charge trapping memory cells, on a semiconductor substrate. A row decoder 1601 is coupled to a plurality of wordlines 1602 arranged along rows in the memory array 1600. A column decoder 1603 is coupled to a plurality of current control lines/inversion bit lines 1604 arranged along columns in the memory array 1600.

Addresses are supplied on bus 1605 to column decoder 1603 and row decoder 1601. Sense amplifiers and data-in structures in block 1606 are coupled to the column decoder 1603 via data bus 1607. Data is supplied via the data-in line 1611 from input/output ports on the integrated circuit 1650, or from other data sources internal or external to the integrated circuit 1650, to the data-in structures in block 1606. Data is supplied via the data-out line 1612 from the sense amplifiers in block 1606 to input/output ports on the integrated circuit 1650, or to other data destinations internal or external to the integrated circuit 1650. A bias arrangement state machine 1609 controls the application of bias arrangement supply voltages 1608, such as for the erase verify and program verify voltages, the bias arrangements for programmg, reading and erasing the memory cells in the array, as described above, including an FN tunneling, charge balancing erase operation.

Accordingly, memory technology is provided based on inversion bit line, charge trapping memory cells. The cells can store multiple bits per cell using fast, low current programming procedures, and has good retention characteristics. The structure does not suffer charge coupling between charge storage structures in adjacent cells, as can happen with floating gate memory in dense arrays. The array is relatively simple to manufacture, requiring for example only two polysilicon layers in some embodiments. Further, the memory can be implemented to eliminate problems with over-erase, by using a positive voltage low threshold state.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit memory, comprising:
a semiconductor body having a first conductivity type;
a plurality of word lines overlying the semiconductor body;
an array of memory cells between the plurality of word lines and the semiconductor body, the array including at least one sector, and the memory cells including respective control gates contacting word lines in the plurality of word lines, and charge trapping structures between the control gates and the semiconductor body;
a plurality of current control lines arranged generally orthogonally with respect to the plurality of word lines, between columns of memory cells in the array, and overlying the semiconductor body, arranged to induce inversion bit lines in the semiconductor body in response to bias voltages applied to the current control lines;
control circuitry coupled to the plurality of current control lines, the plurality of word lines and the semiconductor body, the control circuitry applying biasing arrangements for programming and erasing data by charge storage in the memory cells, and for reading stored data; wherein
the biasing arrangement for programming a bit of data on a left side of a particular memory cell in the array induces source side hot electron injection on the left side of the charge trapping structure via inversion bit lines to establish a high threshold state for reads of the left side;
the biasing arrangement for programming a bit of data on a right side of the particular memory cell in the array induces source side hot electron injection on the right side of the charge trapping structure via inversion bit lines to establish a high threshold state for reads of the right side;
the biasing arrangement for erasing data in the at least one sector includes inducing charge balancing, by applying a negative voltage between at least one word line coupled to the memory cells in the sector and the semiconductor body sufficient to induce FN tunneling between the charge trapping structure and the semiconductor body balanced by FN tunneling between the control gate and the charge trapping structure, until a target low threshold voltage is established in the memory cells in the sector;
the biasing arrangement for reading a bit of data on one of a left side and a right side of a particular memory cell in the array induces relatively conductive inversion bit lines on the left and right sides of the particular memory cell and applies a read bias voltage to the word line coupled to the control gate of the particular memory cell.

2. The memory of claim 1, wherein the biasing arrangement for programming a bit of data on one side of the left and right sides of the particular memory cell includes applying a body bias voltage to the semiconductor body,
applying a program voltage to a word line coupled to the particular memory cell and to other memory cells coupled to the word line including a second memory cell to the one side,
applying first bias voltage to a first current control line adjacent to the particular memory cell on the other side of the left and right sides, sufficient to induce a relatively conductive inversion bit line beneath the first current control line forming a drain terminal for the particular memory cell, and coupling a drain voltage to the drain terminal via the inversion bit line beneath the first current control line,
applying a second bias voltage to a second current control line sufficient to induce a relatively resistive inversion bit line beneath the second current control line adjacent to the particular memory cell on the one side, and applying a third bias voltage to a third current control line sufficient to induce a relatively conductive inversion bit line beneath the third current control line adjacent to the second memory cell on the one side, forming a source terminal for the particular memory cell, and coupling a source voltage to the source terminal via the inversion bit lines beneath the second and third current control lines.

3. The memory of claim 1, wherein the biasing arrangement for reading a bit of data on one side of the left and right sides of the particular memory cell includes
applying a read voltage to a word line coupled to the particular memory cell;
applying first bias voltage to a first current control line adjacent to the particular memory cell on the other side of the left and right sides, sufficient to induce a relatively conductive inversion bit line beneath the first current control line forming a drain terminal for the particular memory cell, and coupling a drain voltage to the drain terminal via the inversion bit line beneath the first current control line,
applying a second bias voltage to a second current control line adjacent to the particular memory cell on the one side of the left and right sides, sufficient to induce a relatively conductive inversion bit line beneath the second current control line forming a source terminal for the particular memory cell, and coupling a source voltage to the source terminal via the inversion bit line beneath the second current control line.

4. The memory of claim 1, wherein the target low threshold voltage is greater than 2 volts.

5. The memory of claim 1, wherein the target low threshold voltage is greater than 3 volts.

6. The memory of claim 1, wherein the control gates in the plurality of memory cells comprise materials with work functions higher than about 4.25 eV.

7. The memory of claim 1, wherein the control gates in the plurality of memory cells comprise p-type polysilicon.

8. The memory of claim 1, wherein the control gates in the plurality of memory cells comprise p-type polysilicon and the plurality of current control conductors comprise n-type polysilicon.

9. The memory of claim 1, wherein the plurality of current control conductors comprise conductive lines having widths about equal to a minimum feature size for a manufacturing process utilized to form them.

10. The memory of claim 1, wherein the charge trapping structures comprise a bottom layer including silicon dioxide, a middle layer including silicon nitride, and a top layer including silicon dioxide.

11. A method for operating an integrated circuit memory, wherein the memory includes a semiconductor body having a first conductivity type; a plurality of word lines overlying the semiconductor body; an array of memory cells between the plurality of word lines and the semiconductor body, the array including at least one sector, and the memory cells including respective control gates contacting word lines in the plurality of word lines, and charge trapping structures between the control gates and the semiconductor body; and a plurality of current control lines arranged generally orthogonally with respect to the plurality of word lines, between columns of memory cells in the array, and overlying the semiconductor body, arranged to induce inversion bit lines in the semiconductor body in response to bias voltages applied to the current control lines; the method comprising
applying a biasing arrangement for programming a bit of data on a left side of a particular memory cell in the array to induce source side hot electron injection on the left side of the charge trapping structure via inversion bit lines to establish a high threshold state for reads of the left side;
applying a biasing arrangement for programming a bit of data on a right side of the particular memory cell in the array to induce source side hot electron injection on the right side of the charge trapping structure via inversion bit lines to establish a high threshold state for reads of the right side;
applying a biasing arrangement for erasing a data in the at least one sector including inducing charge balancing, by applying a negative voltage between at least one word line coupled to the memory cells in the sector and the semiconductor body and, sufficient to induce FN tunneling between the charge trapping structure and the semiconductor body balanced by FN tunneling between the control gate and the charge trapping structure, until a target low threshold voltage is established in the memory cells in the sector; and
applying a biasing arrangement for reading a bit of data on a left side of a particular memory cell in the array to induce relatively conductive inversion bit lines on the left and right sides of the particular memory cell and applies a read bias voltage to the word line coupled to the control gate of the particular memory cell.

12. The method of claim 11, wherein the biasing arrangement for programming a bit of data on one side of the left and right sides of the particular memory cell includes applying a body bias voltage to the semiconductor body,
applying a program voltage to a word line coupled to the particular memory cell and to other memory cells coupled to the word line including a second memory cell to the one side,
applying first bias voltage to a first current control line adjacent to the particular memory cell on the other side of the left and right sides, sufficient to induce a relatively conductive inversion bit line beneath the first current control line forming a drain terminal for the particular memory cell, and coupling a drain voltage to the drain terminal via the inversion bit line beneath the first current control line,
applying a second bias voltage to a second current control line sufficient to induce a relatively resistive inversion bit line beneath the second current control line adjacent to the particular memory cell on the one side, and applying a third bias voltage to a third current control line sufficient to induce a relatively conductive inversion bit line beneath the third current control line adjacent to the second memory cell on the one side, forming a source terminal for the particular memory cell, and coupling a source voltage to the source terminal via the inversion bit lines beneath the second and third current control lines.

13. The method of claim 11, wherein the biasing arrangement for reading a bit of data on one side of the left and right sides of the particular memory cell includes
applying a read voltage to a word line coupled to the particular memory cell;
applying first bias voltage to a first current control line adjacent to the particular memory cell on the other side of the left and right sides, sufficient to induce a relatively conductive inversion bit line beneath the first current control line forming a drain terminal for the particular memory cell, and coupling a drain voltage to the drain terminal via the inversion bit line beneath the first current control line,
applying a second bias voltage to a second current control line adjacent to the particular memory cell on the one side of the left and right sides, sufficient to induce a relatively conductive inversion bit line beneath the second current control line forming a source terminal for the particular memory cell, and coupling a source voltage to the source terminal via the inversion bit line beneath the second current control line.

14. The method of claim 11, wherein the target low threshold voltage is greater than 2 volts.

15. The method of claim 11, wherein the target low threshold voltage is greater than 3 volts.

16. The method of claim 11, including before programming memory cells in the at least one sector, applying a biasing arrangement for setting a low threshold state in the at least one sector including inducing charge balancing, by applying a negative voltage between at least one word line coupled to the memory cells in the sector and the semiconductor body and, sufficient to induce FN tunneling between the charge trapping structure and the semiconductor body balanced by FN tunneling between the control gate and the charge trapping structure, until a target low threshold voltage is established in the memory cells in the sector.

17. An integrated circuit memory, comprising:
a semiconductor body having a first conductivity type;
a plurality of word lines overlying the semiconductor body;
an array of memory cells between the plurality of word lines and the semiconductor body, the array including at least one sector, and the memory cells including respective control gates contacting word lines in the plurality of word lines, and charge trapping structures between the control gates and the semiconductor body, the control gates comprising a material having a work function greater than about 4.25 eV;
a plurality of current control lines arranged generally orthogonally with respect to the plurality of word lines, between columns of memory cells in the array, and overlying the semiconductor body, arranged to induce inversion bit lines in the semiconductor body in response to bias voltages applied to the current control lines;
control circuitry coupled to the plurality of current control lines, the plurality of word lines and the semiconductor body, the control circuitry applying biasing arrangements for programming and erasing data by charge storage in the memory cell structures, and for reading stored data; wherein the biasing arrangement for erasing a data in the at least one sector includes inducing charge balancing, by applying a negative voltage between at least one word line coupled to the memory cells in the sector and the semiconductor body and, sufficient to induce FN tunneling between the charge trapping structure and the semiconductor body balanced by FN tunneling between the control gate and the charge trapping structure, until a target low threshold voltage is established in the memory cells in the sector.

18. The memory of claim 17, wherein the biasing arrangement for programming a bit of data on one side of the left and right sides of a particular memory cell includes applying a body bias voltage to the semiconductor body,
applying a program voltage to a word line coupled to the particular memory cell and to other memory cells coupled to the word line including a second memory cell to the one side,
applying first bias voltage to a first current control line adjacent to the particular memory cell on the other side of the left and right sides, sufficient to induce a relatively conductive inversion bit line beneath the first current control line forming a drain terminal for the particular memory cell, and coupling a drain voltage to the drain terminal via the inversion bit line beneath the first current control line,
applying a second bias voltage to a second current control line sufficient to induce a relatively resistive inversion bit line beneath the second current control line adjacent to the particular memory cell on the one side, and
applying a third bias voltage to a third current control line sufficient to induce a relatively conductive inversion bit line beneath the third current control line adjacent to the second memory cell on the one side, forming a source terminal for the particular memory cell, and coupling a source voltage to the source terminal via the inversion bit lines beneath the second and third current control lines.

19. The memory of claim 17, wherein the biasing arrangement for reading a bit of data on one side of the left and right sides of a particular memory cell includes
applying a read voltage to a word line coupled to the particular memory cell;
applying first bias voltage to a first current control line adjacent to the particular memory cell on the other side of the left and right sides, sufficient to induce a relatively conductive inversion bit line beneath the first current control line forming a drain terminal for the particular memory cell, and coupling a drain voltage to the drain terminal via the inversion bit line beneath the first current control line,
applying a second bias voltage to a second current control line adjacent to the particular memory cell on the one side of the left and right sides, sufficient to induce a relatively conductive inversion bit line beneath the second current control line forming a source terminal for the particular memory cell, and coupling a source voltage to the source terminal via the inversion bit line beneath the second current control line.

20. The memory of claim 17, wherein the target low threshold voltage is greater than about 2 volts.

21. The memory of claim 17, wherein the target low threshold voltage is greater than about 3 volts.

22. The memory of claim 17, wherein the control gates in the plurality of memory cells comprise p-type polysilicon.

23. The memory of claim 17, wherein the plurality of current control conductors comprise conductive lines having widths about equal to a minimum feature size for a manufacturing process utilized to form them.

24. The memory of claim 17, wherein the charge trapping structures comprise a bottom layer including silicon dioxide, a middle layer including silicon nitride, and a top layer including silicon dioxide.

* * * * *